(12) United States Patent
Naitoh

(10) Patent No.: US 6,445,564 B1
(45) Date of Patent: Sep. 3, 2002

(54) POWER SUPPLY BYPASS CAPACITOR CIRCUIT FOR REDUCING POWER SUPPLY NOISE AND SEMICONDUCTOR INTEGRATED CIRCUIT DEVICE HAVING THE CAPACITOR CIRCUIT

(75) Inventor: Mutsuhiro Naitoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/444,826

(22) Filed: Nov. 22, 1999

(30) Foreign Application Priority Data

Feb. 25, 1999 (JP) .......................... 11-048055

(51) Int. Cl.[7] .............................. H01G 4/00
(52) U.S. Cl. .................. 361/301.2; 361/306.1; 361/306.3; 361/321; 361/311; 357/45
(58) Field of Search .............. 361/301.2, 306.3, 361/303, 329, 321, 572, 306.2, 311; 357/45

(56) References Cited

U.S. PATENT DOCUMENTS

| | | | | |
|---|---|---|---|---|
| 4,736,137 A | * | 4/1988 | Ohwada et al. | 315/169.3 |
| 4,989,062 A | * | 1/1991 | Takahashi et al. | 357/45 |
| 5,598,029 A | * | 1/1997 | Suzuki | 257/665 |
| 5,666,004 A | * | 9/1997 | Bhattacharyya et al. | 257/724 |

FOREIGN PATENT DOCUMENTS

| | | |
|---|---|---|
| JP | 63-87845 | 6/1988 |
| JP | 4-287360 | 10/1992 |
| JP | 5-136567 | 6/1993 |
| JP | 10-74667 | 3/1998 |

* cited by examiner

*Primary Examiner*—Dean A. Reichard
*Assistant Examiner*—Nguyen Ha
(74) *Attorney, Agent, or Firm*—Armstrong, Westerman & Hattori, LLP.

(57) ABSTRACT

A capacitor circuit has a first electrode, a second electrode, and a dielectric interposed between the first and second electrodes, and a plurality of first wiring lines, each functioning as the first electrode, and a plurality of second wiring lines, each functioning as the second electrode, are formed alternately one adjacent to the other within the same wiring layer. With this arrangement, the capacitance of the capacitor circuit can be made large without incurring an increase in the area it occupies.

16 Claims, 9 Drawing Sheets

THIRD LAYER (30)

SECOND LAYER (20)

FIRST LAYER (10)

POWER SUPPLY BYPASS CAPACITOR CIRCUIT FOR REDUCING POWER SUPPLY NOISE AND SEMICONDUCTOR INTEGRATED CIRCUIT DEVICE HAVING THE CAPACITOR CIRCUIT

BACKGROUND OF THE INVENTION

1. Field of the Invention

The present invention relates to a capacitor circuit and a semiconductor integrated circuit device, and more particularly, to a power supply bypass capacitor circuit for reducing power supply noise in a semiconductor integrated circuit device.

2. Description of the Related Art

In a semiconductor integrated circuit device, it has traditionally been practiced to provide a capacitor circuit between power supplies for noise elimination and other purposes. The prior art capacitor circuit (power supply bypass capacitor) is constructed by forming the power supply wiring pattern and ground pattern of the same shape using different wiring layers formed one above the other in the thickness direction of the substrate and separated in the vertical direction (the thickness direction of the substrate) by the insulating film.

The recent trend in semiconductor integrated circuit devices, despite decreasing feature size and increasing packing density, has the tendency to increase insulating film thickness between wiring layers in order to reduce capacitance on signal lines. With the traditional capacitor circuit design which relies on insulating film thickness, the area that the capacitor circuit occupies will inevitably increase if power supply noise, which is expected to continue to increase in future, is to be reduced sufficiently.

Further, with decreasing feature size and increasing packing density of the semiconductor integrated circuit device, power supply noise is expected to increase in the future due to increased operating clock speed, and there is thus a need to further increase the bypass capacitance between power supplies.

In view of this, there is a need to provide a capacitor circuit that can present a large capacitance without incurring an increase in the area that it occupies, and a semiconductor integrated circuit device having such a capacitor circuit.

The prior art and the problems thereof will be explained later with reference to the accompanying drawings.

SUMMARY OF THE INVENTION

An object of the present invention is to provide a capacitor circuit that can present a large capacitance without incurring an increase in the area that it occupies, and a semiconductor integrated circuit device having such a capacitor circuit.

According to the present invention, there is provided a capacitor circuit comprising a first electrode, a second electrode, and a dielectric interposed between the first and second electrodes, wherein a plurality of first wiring lines, each functioning as the first electrode, and a plurality of second wiring lines, each functioning as the second electrode, are formed alternately one adjacent to the other within the same wiring layer.

The wiring layer may include a first wiring layer and a second wiring layer formed one above the other in adjacent fashion in a direction of layer thickness, and the first and second wiring lines in the first wiring layer may be arranged in such a manner as to align respectively with the second and first wiring lines in the second wiring layer in the direction of layer thickness. The wiring layer may include a first wiring layer and a second wiring layer formed one above the other in adjacent fashion in a direction of layer thickness, and the first and second wiring lines in the first wiring layer may be formed in such a manner as to intersect the first and second wiring lines in the second wiring layer.

The wiring layer may include a first wiring layer, a second wiring layer, and a third wiring layer formed one above another in a direction of layer thickness, and wherein a plurality of the first wiring lines and a plurality of the second wiring lines may be formed alternately one adjacent to the other in each of the first and third wiring layers, and may contact for connection to the first and second wiring lines in the first and third wiring layers are formed on the second wiring layer. A plurality of the first wiring lines and a plurality of the second wiring lines may be formed alternately one adjacent to the other in the second wiring layer in such a manner as to intersect the first and second wiring lines in the first and third wiring layers.

The first and second wiring lines may be formed parallel to each other, each with a minimum line width, within the same wiring layer. The dielectric may be an insulating film formed between the first and second wiring lines. Each of the wiring layers may be a metal wiring layer. The first and second wiring lines may be ring wiring lines around a hard macro mounted on a semiconductor integrated circuit device.

Further, according to the present invention, there is also provided a semiconductor integrated circuit device having a first power supply line and a second power supply line, wherein a plurality of the first power supply lines and a plurality of the second power supply lines are formed alternately one adjacent to the other within the same metal wiring layer to construct a capacitor circuit.

The metal wiring layer may include a first metal wiring layer and a second metal wiring layer formed one above the other in adjacent fashion in a direction of layer thickness, and the first and second power supply lines in the first metal wiring layer may be arranged in such a manner as to align respectively with the second and first power supply lines in the second metal wiring layer in the direction of layer thickness. The metal wiring layer may include a first metal wiring layer and a second metal wiring layer formed one above the other in adjacent fashion in a direction of layer thickness, and the first and second power supply lines in the first metal wiring layer may be formed in such a manner as to intersect the first and second power supply lines in the second metal wiring layer.

The metal wiring layer may include a first metal wiring layer, a second metal wiring layer, and a third metal wiring layer formed one above another in a direction of layer thickness, and wherein a plurality of the first power supply lines and a plurality of the second power supply lines may be formed alternately one adjacent to the other in each of the first and third metal wiring layers, and may contact for connection to the first and second power supply lines in the first and third metal wiring layers are formed on the second metal wiring layer. A plurality of the second power supply lines may be formed alternately one adjacent to the other in the second metal wiring layer in such a manner as to intersect the first and second power supply lines in the first and third metal wiring layers.

The first and second power supply lines may be formed parallel to each other, each with a minimum line width, within the same wiring layer. The power supply bypass capacitor circuit may be constructed using ring wiring lines for a hard macro mounted on the semiconductor integrated circuit device.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before proceeding to the detailed description of the capacitor circuit and semiconductor integrated circuit device according to the present invention, the prior art and its associated problems will be described first with reference to drawing.

In a semiconductor integrated circuit device, it has traditionally been practiced to provide a capacitor circuit between power supplies for noise elimination and other purposes.

Figure 1:
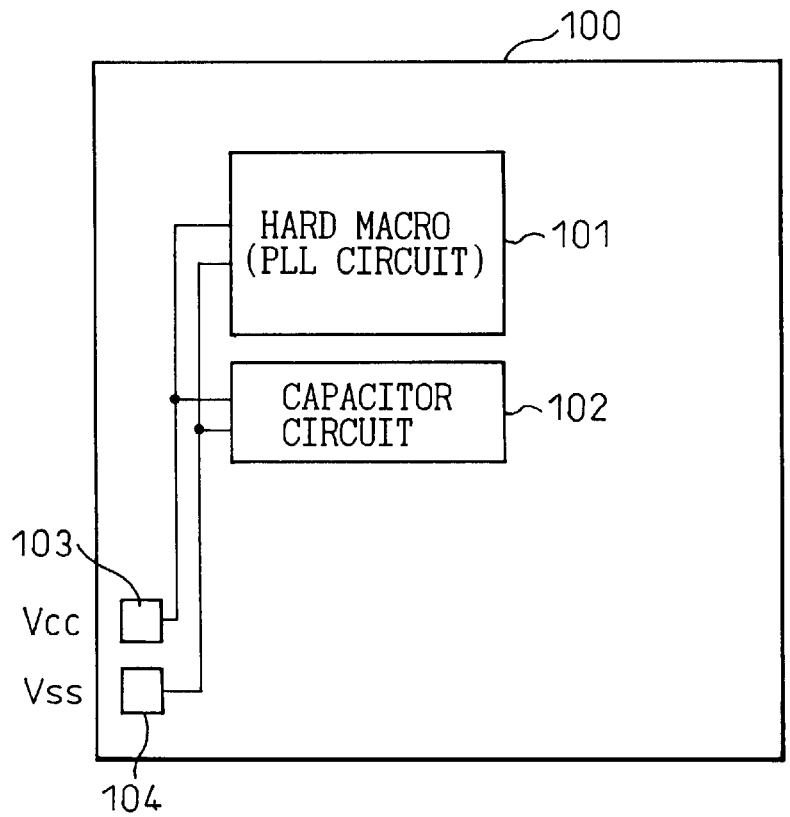
FIG. 1 is a diagram schematically showing one example of a prior art semiconductor integrated circuit device.

FIG. 1 is a diagram schematically showing one example of a prior art semiconductor integrated circuit device. In FIG. 1, reference numeral 100 is the semiconductor integrated circuit device, 101 is a hard macro such as a PLL circuit (circuit module, sub circuit), 102 is a capacitor circuit (power supply bypass capacitor), and 103 and 104 are power supply pads. The power supply pad 103 is a pad for a high-level voltage supply (power supply line Vcc) and the power supply pad 104 is a pad for a low-level voltage supply (ground line Vss).

As shown in FIG. 1, in the prior art semiconductor integrated circuit device 100, the capacitor circuit 102 for noise elimination and other purposes is formed in a space near the hard macro 101.

Figure 2:
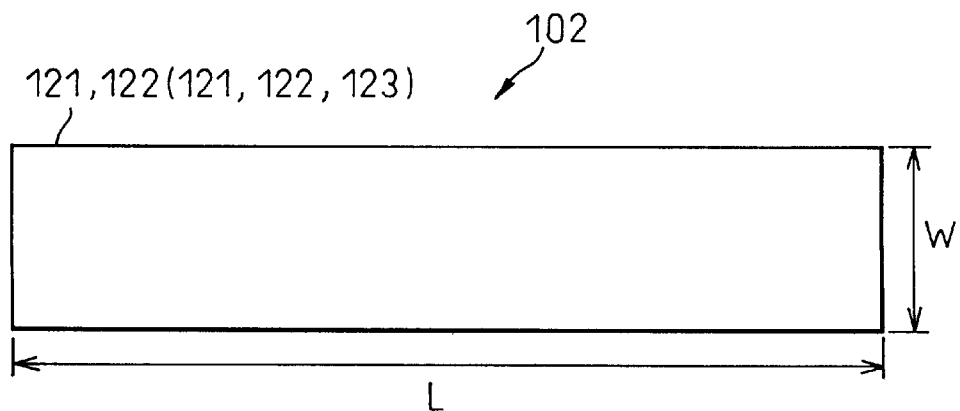
FIG. 2 is a plan view showing a capacitor circuit in the semiconductor integrated circuit device of FIG, 1.

FIG. 2 is a plan view showing the capacitor circuit 102 in the semiconductor integrated circuit device of FIG. 1. Here, the length of the capacitor circuit 102 (the length of each electrode) is denoted by L and the width by W.

Figure 3:
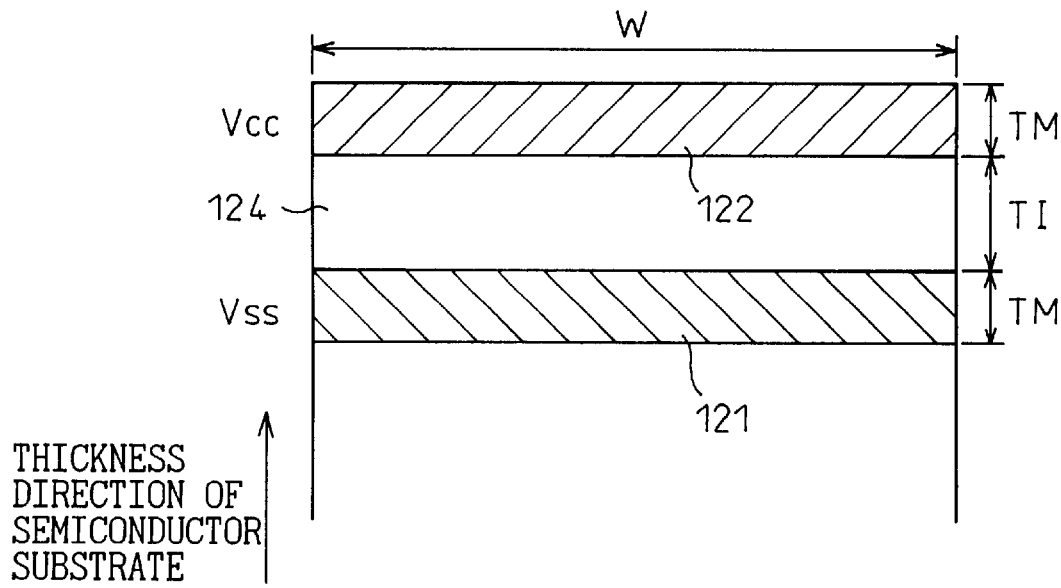
FIG. 3 is a cross-sectional view showing one example of the capacitor circuit in the prior art semiconductor integrated circuit device.

FIG. 3 is a cross-sectional view showing one example of the capacitor circuit in the prior art semiconductor integrated circuit device. In FIG. 3, reference character TM indicates the thickness of a metal wiring layer (aluminum electrode) and TI shows the thickness of an insulating film.

As shown in FIGS. 2 and 3, the prior art capacitor circuit 102 consists of a first electrode (for example, an aluminum electrode) 121, an insulating film (for example, a silicon oxide film) 124, and a second electrode (for example, an aluminum electrode) 122, all being solid and identical in shape when viewed from the top, and stacked in the order named, for example, in the thickness direction of the semiconductor substrate. More specifically, the capacitor circuit 102 consists of the two rectangular electrodes 121 and 122 shown in FIG. 2 and the insulating film 124 interposed therebetween.

In a specific example, when the length L of each of the electrodes 121 and 122 is 250 $\mu$m and the width W 52 $\mu$m, and the thickness TI of the insulating film 124 is 0.92 $\mu$m, then the capacitance Cl of the capacitor circuit shown in FIG. 3 is given by the following equation.

$$C1 = 4.1 \cdot 8.854 \times 10^{-12} \cdot (250 \times 10^{-6} \cdot 52 \times 10^{-6})/(0.92 \times 10^{-6}) = 0.513 \text{ [pF]}$$

In the above equation, the constant 8.854 is the permittivity in vacuum, and 4.1 is the relative permittivity of the insulating film.

Figure 4:
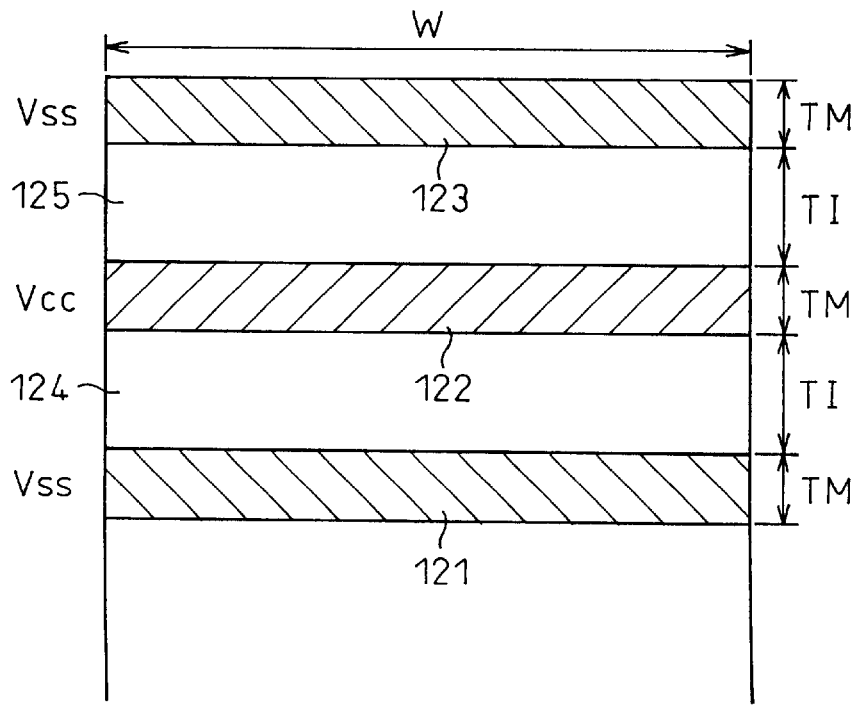
FIG. 4 is a cross-sectional view showing another example of the capacitor circuit in the prior art semiconductor integrated circuit device.

FIG. 4 is a cross-sectional view showing another example of the capacitor circuit in the prior art semiconductor integrated circuit device. The capacitor circuit shown in FIG. 4 includes, in addition to the capacitor circuit of FIG. 3, an insulating film (for example, a silicon oxide film) 125 and a third electrode (for example, an aluminum electrode) 123 stacked in this order in the thickness direction of the substrate.

The capacitance C2 of the capacitor circuit shown in FIG. 4 is twice the capacitance Cl of the capacitor circuit of FIG. 3, that is, C2=1.03 [pF].

However, capacitor circuits having this magnitude of capacitance are unable to sufficiently reduce the power supply noise, as will be explained later.

Figure 5:
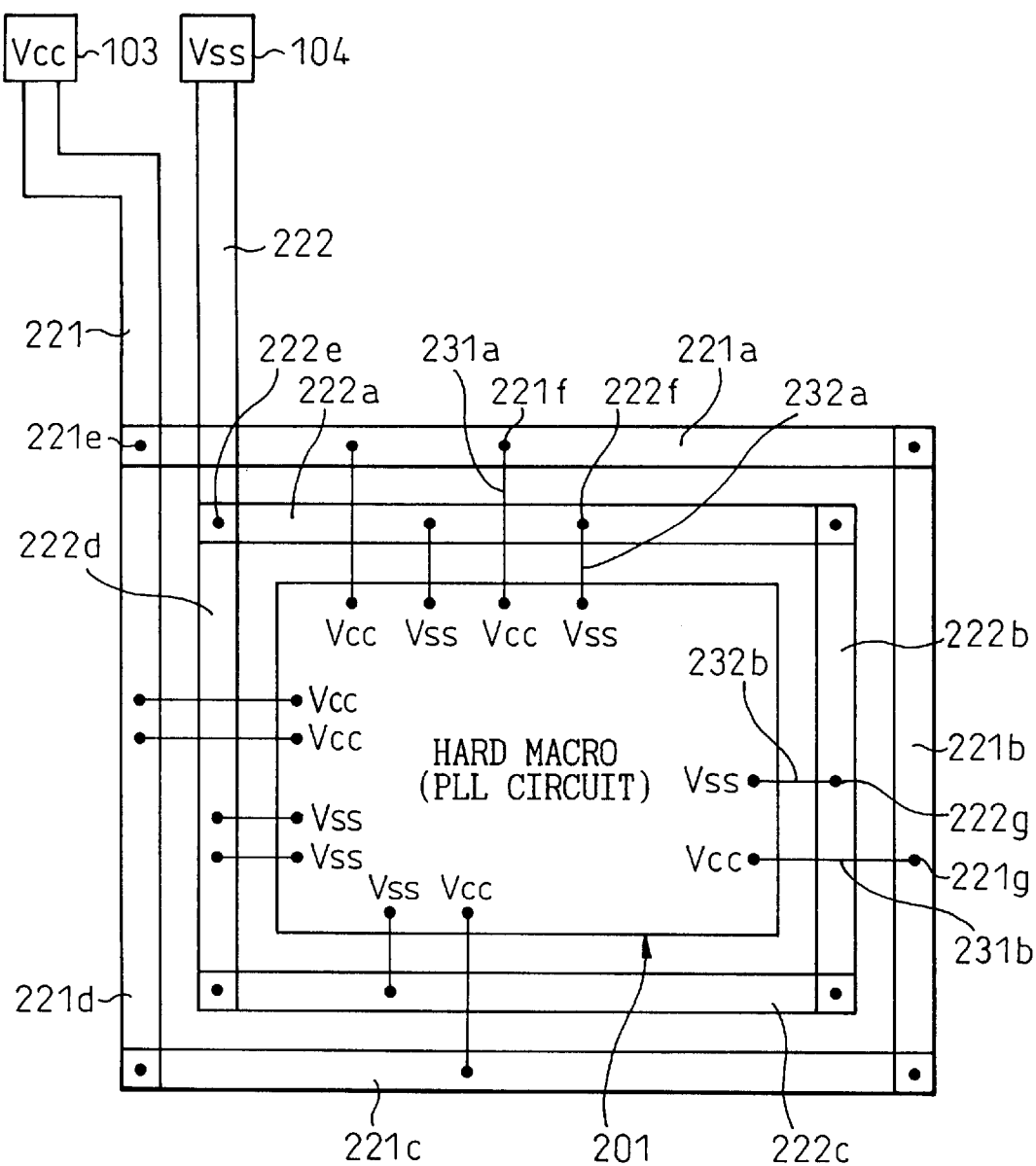
FIG. 5 is a plan view schematically showing ring wiring for a hard macro mounted on the prior art semiconductor integrated circuit device.

FIG. 5 is a plan view schematically showing ring wiring for the hard macro mounted on the prior art semiconductor integrated circuit device. In FIG. 5, reference numeral 201 is the hard macro such as a PLL circuit (circuit module, sub circuit), 221a to 221d are ring wiring lines for the high-level voltage supply (power supply line Vcc), and 222a to 222d are ring wiring lines for the low-level voltage supply (ground line Vss). Further, reference numeral 221 is the power supply line (Vcc), 222 is the ground line (Vss), 221e, 221f, 221g, 222e, 222f, and 222g are contact holes, and 231a, 231b, 232a, and 232b are interconnect lines. The hard macro 201 shown here corresponds to the hard macro 101 in FIG. 1.

The ring wiring lines 221a, 222a, 221c, and 222c are formed, for example, in the first metal wiring layer, while the ring wiring lines 221b, 222b, 221d, and 222d are formed, for example, in the second metal wiring layer; these wiring lines are connected in ring form by the respective contact holes. For example, the contact hole 221e electrically connects the power supply line 221 and ring wiring line 221a formed in the first metal wiring layer to the ring wiring line 221d formed in the second metal wiring layer, and the contact hole 222*e* electrically connects the ring wiring line 222*a* formed in the first metal wiring layer to the ground line 222 and ring wiring line 222*d* formed in the second metal wiring layer.

The contact hole 221*f* electrically connects the ring wiring line 221*a* formed in the first metal wiring layer to the interconnect line 231*a* formed in the second metal wiring layer, to supply the high-level supply voltage (power supply voltage) Vcc to the hard macro 201, and the contact hole 222*f* electrically connects the ring wiring line 222*a* formed in the first metal wiring layer to the interconnect line 232*a* formed in the second metal wiring layer, to supply the low-level supply voltage (ground voltage) Vss to the hard macro 201. Further, the contact hole 221*g* electrically connects the ring wiring line 221*b* formed in the second metal wiring layer to the interconnect line 231*b* formed in the first metal wiring layer, to supply the high-level supply voltage Vcc to the hard macro 201, and the contact hole 222*g* electrically connects the ring wiring line 222*b* formed in the second metal wiring layer to the interconnect line 232*b* formed in the first metal wiring layer, to supply the low-level supply voltage Vss to the hard macro 201.

In this way, the ring wiring lines (power supply rings) 221*a* to 221*d* and 222*a* to 222*d* provided around the hard macro 201 are connected by the plurality of interconnect lines at a plurality of points so that supply voltage differences, etc. will not arise among different points in the hard macro 201.

As earlier described, the prior art capacitor circuit (power supply bypass capacitor) is constructed by forming the power supply wiring pattern and ground pattern of the same shape using different wiring layers formed one above the other in the thickness direction of the substrate and separated in the vertical direction (the thickness direction of the substrate) by the insulating film.

However, with recent advances in semiconductor manufacturing technology, semiconductor integrated circuit devices have been decreasing in feature size and increasing in packing density (for larger scale and higher capacity). With this trend, the insulating film providing the separation in the thickness direction of the substrate (the vertical direction) has been increasing in thickness in order to reduce the capacitance on normal signal lines; as a result, it has become difficult to secure sufficient capacitance if the capacitor circuit is constructed using conventional techniques. That is, to obtain sufficient capacitance, the area of the capacitor circuit must be increased, necessitating a corresponding increase in the chip (semiconductor integrated circuit device) area contrary to the recent demand for smaller feature size and higher packing density for semiconductor integrated circuit devices.

Furthermore, with decreasing feature size and increasing packing density of the semiconductor integrated circuit device, power supply noise is expected to increase due to an increased operating clock speed, and there is thus a need to further increase the bypass capacitance between power supplies.

Embodiments of the capacitor circuit and semiconductor integrated circuit device according to the present invention will be described in detail below.

Figure 6:
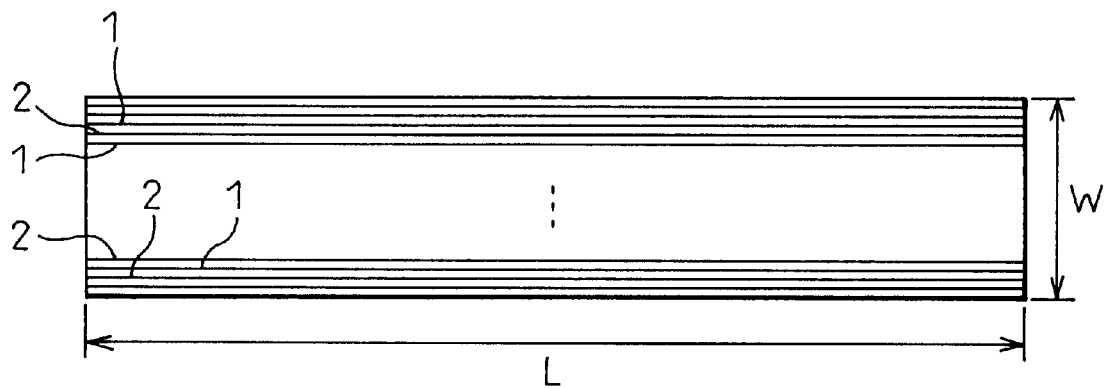
FIG. 6 is a plan view schematically showing one embodiment of the capacitor circuit in the semiconductor integrated circuit device according to the present invention.
Figure 7:
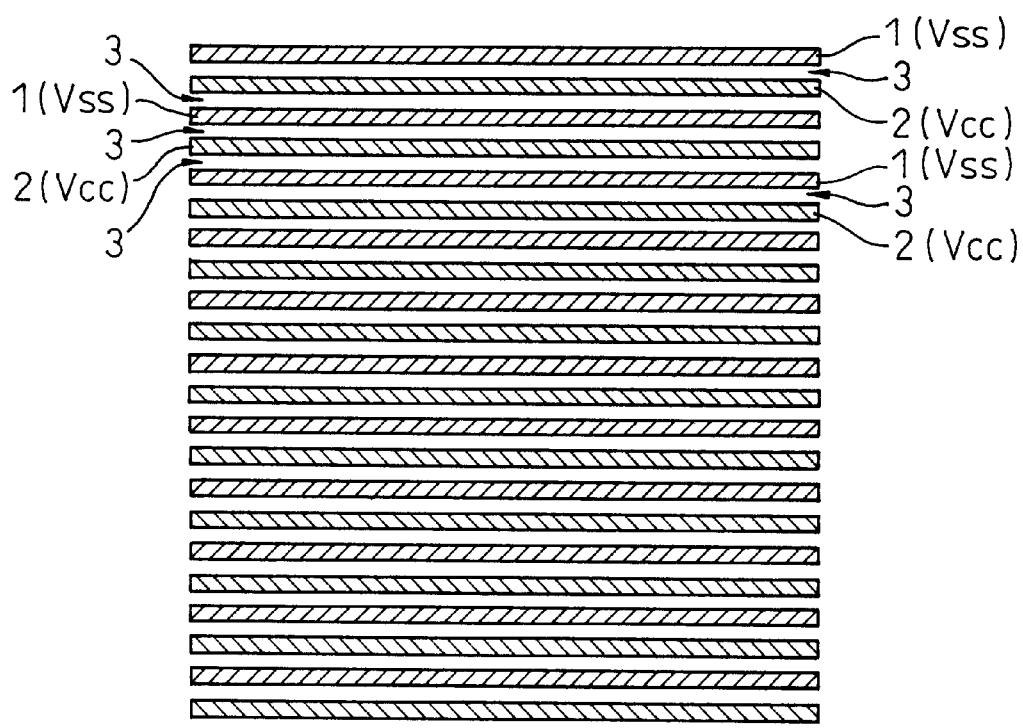
FIG. 7 is a plan view showing a portion enlarged for explaining the capacitor circuit of FIG. 6.

FIG. 6 is a plan view schematically showing one embodiment of the capacitor circuit in the semiconductor integrated circuit device according to the present invention, and FIG. 7 is a plan view showing a portion enlarged for explaining the capacitor circuit of FIG. 6. In FIGS. 6 and 7, reference numeral 1 is a first power supply line (low-level voltage supply line Vss), 2 is a second power supply line (high-level voltage supply line Vcc), and 3 is an insulating film (dielectric). Here, the length of the capacitor circuit (the length of each power supply line) is denoted by L and the width of the entire structure by W.

As shown in FIGS. 6 and 7, the low-level voltage supply lines 1 (ground lines Vss), each functioning as the first electrode, and the high-level voltage supply lines 2 (power supply lines Vcc), each functioning as the second electrode, are formed alternately one adjacent to the other within the same wiring layer. The capacitor circuit is constructed by using as the dielectric the insulating film formed between each low-level voltage supply line 1 and each high-level voltage supply line 2. In this way, by providing the plurality of low-level voltage supply lines 1 and high-level voltage supply lines 2 within the same wiring layer, an appropriate separation is provided between each low-level voltage supply line 1 and its adjacent high-level voltage supply line 2, and by summing the capacitances formed between the respective adjacent power supply lines (1 and 2), the capacitor circuit is designed to provide sufficient capacitance.

Figure 8:
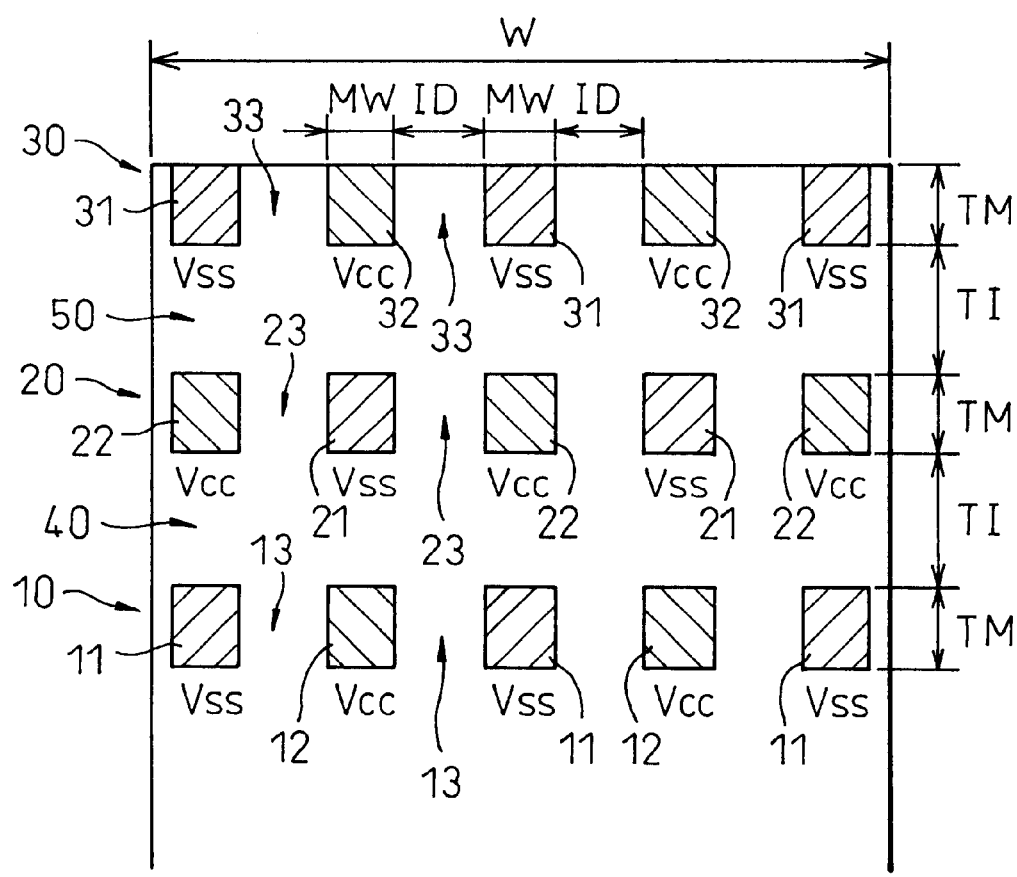
FIG. 8 is a cross-sectional view showing a portion enlarged for explaining the capacitor circuit of FIG. 6.

FIG. 8 is a cross-sectional view showing a portion enlarged for explaining the capacitor circuit of FIG. 6. In FIG. 8, reference numeral 10 is a first metal wiring layer (for example, an aluminum wiring layer), 20 is a second metal wiring layer (for example, an aluminum wiring layer), 30 is a third metal wiring layer (for example, an aluminum wiring layer), 40 is an insulating film (for example, a silicon oxide film) formed between the metal wiring layers 10 and 20, and 50 is an insulating film (for example, a silicon oxide film) formed between the metal wiring layers 20 and 30. Reference character TM designates the thickness of each metal wiring layer (the height of each power supply line), TI the thickness of each insulating film, MW the width of each power supply line, and ID the distance (insulating film width) between adjacent power supply lines in each metal wiring layer. Here, the width MW of each power supply line and the distance ID between the power supply lines are preferably set at values defined, for example, by minimum line width, but this is not an essential requirement.

As shown in FIG. 8, in the present embodiment, the low-level voltage supply lines 1 and high-level voltage supply lines 2 are formed alternately one adjacent to the other within each of the three metal wiring layers 10, 20, and 30, and the high-level voltage supply lines 2 and low-level voltage supply lines 1 in the second metal wiring layer 20 are arranged in such a manner as to align with the low-level voltage supply lines 1 and high-level voltage supply lines 2, respectively, in the first and third metal wiring layers 10 and 30. More specifically, in the first metal wiring layer 10, the low-level voltage supply lines 11 and high-level voltage supply lines 12 are arranged alternately one adjacent to the other in the order named; in the second metal wiring layer 20, the high-level voltage supply lines 22 and low-level voltage supply lines 21 are arranged alternately one adjacent to the other in the order named; and in the third metal wiring layer 30, the low-level voltage supply lines 31 and high-level voltage supply lines 32 are arranged alternately one adjacent to the other in the order named. The capacitor circuit is constructed by using the insulating films 13, 23, and 33 between the low-level voltage supply lines 11, 21, 31 and the high-level voltage supply lines 12, 22, 32 in the respective metal wiring layers 10, 20, and 30 as the dielectrics, and the low voltage supply lines and high voltage supply lines in the respective metal wiring layers as the conductors.

Further, the low-level voltage supply lines 11 and high-level voltage supply lines 12 in the first metal wiring layer 10 are aligned respectively with the high-level voltage supply lines 22 and low-level voltage supply lines 21 in the second metal wiring layer 20 via the insulating film (dielectric) 40 interposed therebetween, and likewise, the high-level voltage supply lines 22 and low-level voltage supply lines 21 in the second metal wiring layer 20 are aligned respectively with the low-level voltage supply lines 31 and high-level voltage supply lines 32 in the third metal wiring layer 30 via the insulating film (dielectric) 50 interposed therebetween; in this way, in the substrate thickness direction also, the capacitor circuit is constructed using the thus aligned low voltage supply lines and high voltage supply lines.

In a specific example, let the length L of each power supply line be 250 $\mu$m, the width W of the entire structure be 52 $\mu$m, the thickness TI of each of the insulating films 40 and 50 be 0.92 $\mu$m, and the height TM of each of the power supply lines 11, 12, 21, 22, 31, and 32 be 0.545 $\mu$m. Further, let the width MW of each power supply line be 0.38 $\mu$m, and the distance ID between adjacent power supply lines in each metal wiring layer be 0.42 $\mu$m. Denoting the capacitance of the first metal wiring layer 10 as C31, the capacitance of the second metal wiring layer 20 as C32, and the capacitance of the third metal wiring layer 30 as C33, the capacitance C3 of the capacitor circuit shown in FIG. 8 is given as C3=C31+C32+C33.

First, the capacitance C31 of the first metal wiring layer 10 is calculated as C31=(C311+C312)·65, where C311 is the capacitance between the adjacent power supply lines 11 and 12 in the first metal wiring layer 10 and C312 is the capacitance in the thickness direction of the substrate due to the power supply lines 11 and 12 in the first metal wiring layer 10. Here, the number of power supply lines (11, 12; 21, 22; 31, 32) in each metal wiring layer is given as W/(MW+IW)=52/(0.38+0.42)=65, and capacitances, etc. at end portions (which have little effect on the total value of the capacitance) are also considered in the addition. Then $$C311=4.1 \cdot 8.854 \times 10^{-12} \cdot \{(0.545 \times 10^{-6} \cdot 250 \times 10^{-6})/(0.42 \times 10^{-6})\} \cdot 2 = 2.355 \times 10^{-14}$$

$$C312=4.1 \cdot 8.854 \times 10^{-12} \cdot (0.38 \times 10^{-6} \cdot 250 \times 10^{-6})/(0.92 \times 10^{-6}) = 3.75 \times 10^{-15}$$

Hence, C31=(2.355×10$^{-14}$+3.75×10$^{-15}$)·65=1.77 [pF]

In the above equations, the constant 8.854 is the permittivity in vacuum, and 4.1 is the relative permittivity of each insulating film. Multiplication by 2 in the equation for obtaining the capacitance C311 between adjacent power supply lines assumes that each power supply line (for example, 11) is flanked by two power supply lines (for example, 12) (actually, only one power supply line is adjacent to each of the endmost power supply lines, but this will have little effect on the calculation of the capacitance value, as noted above). The same applies to the equations given below.

Next, the capacitance C32 of the second metal wiring layer 20 is calculated as C32=(C321+C322)·65, where C321 is the capacitance between the adjacent power supply lines 21 and 22 in the second metal wiring layer 20 and C322 is the capacitance in the thickness direction of the substrate due to the power supply lines 21 and 22 in the second metal wiring layer 20. Then $$C321=4.1 \cdot 8.854 \times 10^{-12} \cdot \{(0.545 \times 10^{-6} \cdot 250 \times 10^{-6})/(0.42 \times 10^{-6})\} \cdot 2 = 2.355 \times 10^{-14}$$

$$C322=4.1 \cdot 8.854 \times 10^{-12} \cdot \{(0.38 \times 10^{-6} \cdot 250 \times 10^{-6})/(0.92 \times 10^{-6})\} \cdot 2 = 7.49 \times 10^{-15}$$

Hence, C32=(2.355×10$^{-14}$+7.49×10$^{-15}$)·65=2.02 [pF]

Multiplication by 2 in the equation for obtaining the capacitance in the thickness direction of the substrate is because both the lower and upper power supply lines 12, 11 and 32, 31 are adjacent to the respective power supply lines 21 and 22.

The capacitance C33 of the third metal wiring layer 30 is approximately the same as the capacitance C31 of the first metal wiring layer 10 described above; therefore, the capacitance C3 of the capacitor circuit shown in FIG. 8 is C3=C31+C32+C33=1.77+2.02+1.77=5.56 [pF]. Accordingly, with three metal wiring layers and with approximately the same occupied area, the capacitance can be obtained that is more than five times as large as the capacitance, C2=1.03 [pF], of the capacitor circuit shown in FIG. 4. In practice, by providing 17 such capacitor circuits (C3), for example, it becomes possible to provide a capacitance of 5.56×17=94.52 or approximately equal to 100 [pF].

Figure 9A:
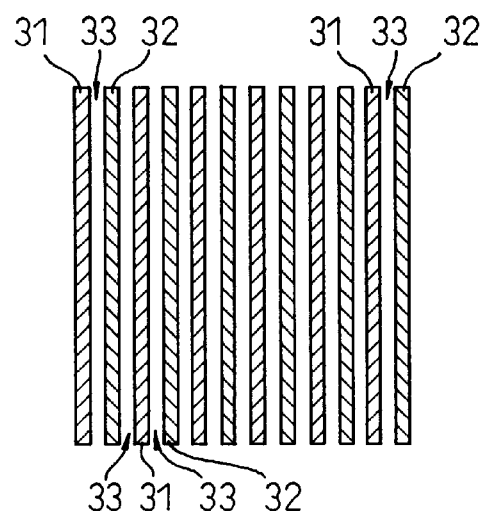
FIGS. 9A, 9B, and 9C are plan views schematically showing another embodiment of the capacitor circuit in the semiconductor integrated circuit device according to the present invention.
Figure 9B:
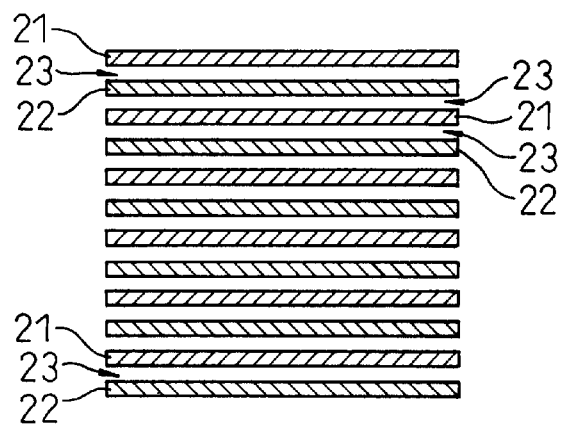
Figure 9C:
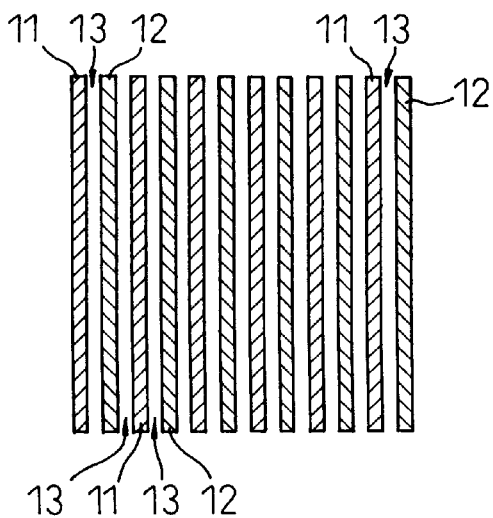
Figure 10:
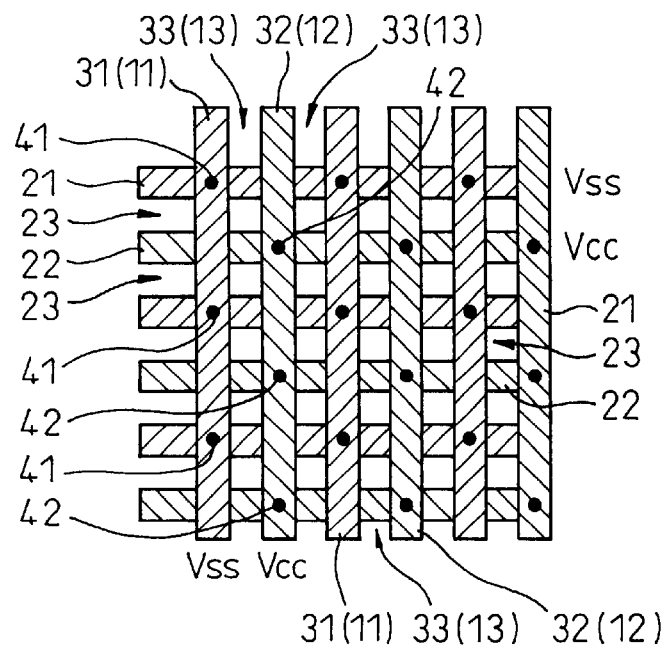
FIG. 10 is a plan view showing a portion enlarged for explaining the capacitor circuit of FIGS. 9A to 9C.

FIGS. 9A, 9B, and 9C are plan views schematically showing another embodiment of the capacitor circuit in the semiconductor integrated circuit device according to the present invention, and FIG. 10 is a plan view showing a portion enlarged for explaining the capacitor circuit of FIGS. 9A to 9C. Here, FIG. 9A is a plan view showing the pattern of power supply lines 31 and 32 in the third metal wiring layer, FIG. 9B is a plan view showing the pattern of power supply lines 21 and 22 in the second metal wiring layer, and FIG. 9C is a plan view showing the pattern of power supply lines 11 and 12 in the first metal wiring layer.

As can be seen from FIGS. 9A to 9C, the power supply lines 11 and 12 in the first metal wiring layer 10 and the power supply lines 31 and 32 in the third metal wiring layer 30 are arranged in corresponding (parallel) relationship to each other, while the power supply lines 21 and 22 in the second metal wiring layer 20 are arranged at right angles to the power supply lines 11, 12 and 31, 32 in the first and third layers.

Further, as shown in FIG. 10, the low-level voltage supply lines 11 and 31 in the first and third layers are electrically connected to the low-level voltage supply lines 21 in the second layer via contact holes 41, and the high-level voltage supply lines 12 and 32 in the first and third layers are electrically connected to the high-level voltage supply lines 22 in the second layer via contact holes 42. In this way, by arranging the power supply lines in the respective layers in a grid pattern and by electrically interconnecting the corresponding power supply lines (Vcc or Vss) via contact holes (41 or 42), voltage differences between the corresponding power supply lines are eliminated and power supply capacity is increased.

Figure 11:
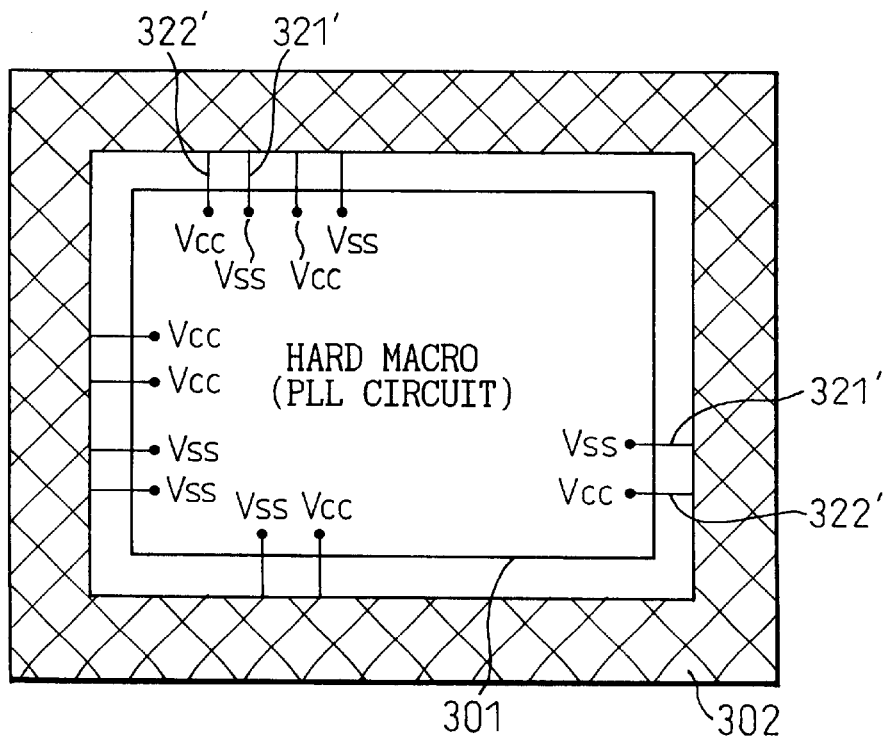
FIG. 11 is a plan view schematically showing ring wiring for the hard macro mounted on the semiconductor integrated circuit device according to the present invention.
Figure 12:
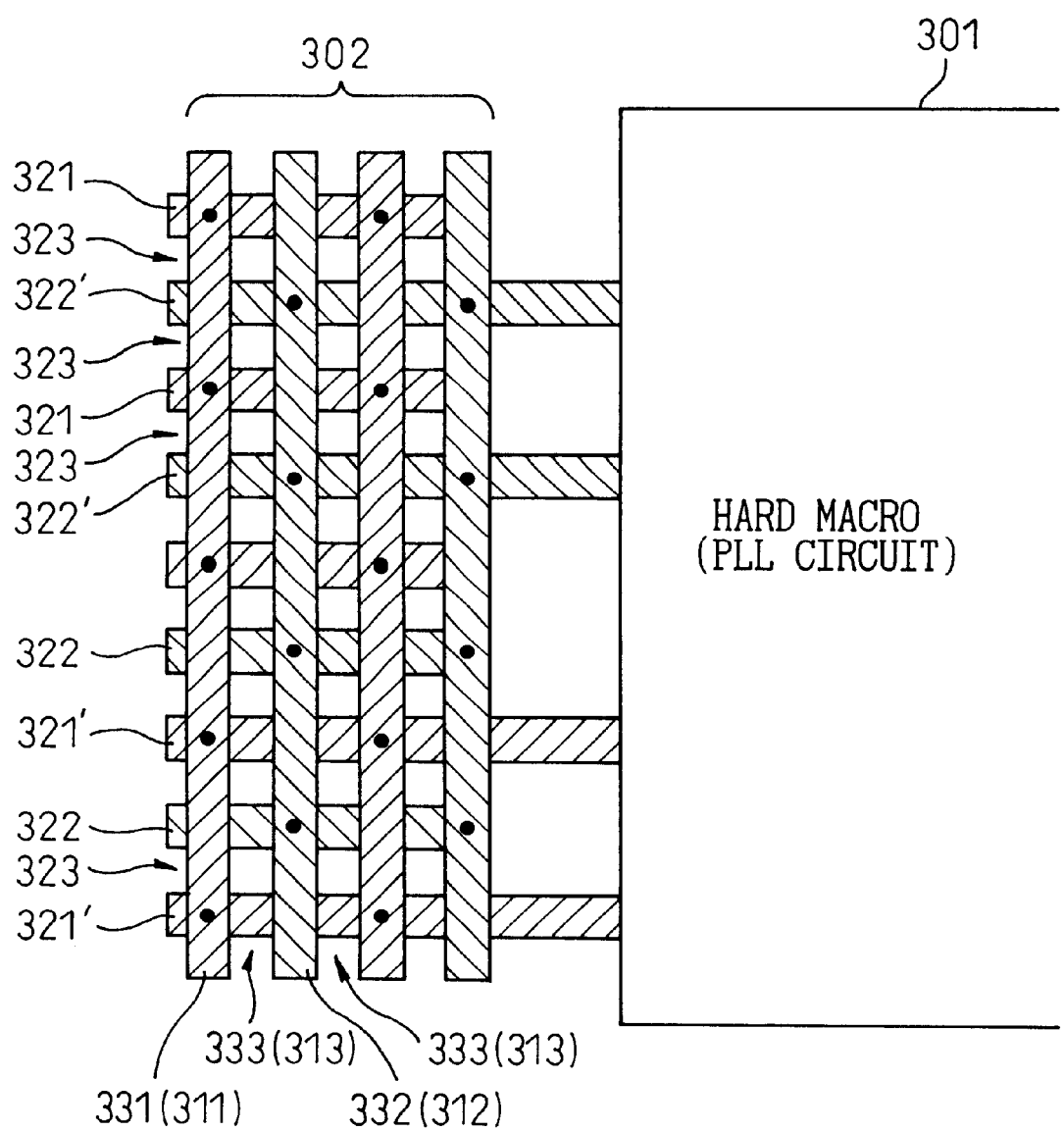
FIG. 12 is a plan view for explaining one example of the ring wiring for the hard macro shown in FIG. 11.

FIG. 11 is a plan view schematically showing ring wiring for the hard macro mounted on the semiconductor integrated circuit device according to the present invention, and FIG. 12 is a plan view for explaining one example of the ring wiring for the hard macro shown in FIG. 11. Here, reference numeral 301 indicates the hard macro, such as a PLL circuit, mounted on the semiconductor integrated circuit device, and 302 shows the ring wiring region. The ring wiring region 302 corresponds to the region where the ring wiring lines 221a to 221d and 222a to 222d in FIG. 5 are formed.

As shown in FIGS. 11 and 12, in the ring wiring region 302, the power supply lines in the respective layers are arranged in a grid pattern, like the pattern previously shown in FIGS. 9A to 9C and FIG. 10; for example, in the second layer (20), the high-level supply voltage Vcc is supplied to the hard macro 301 through the high-level voltage supply lines 322' (power supply lines) and the low-level supply voltage Vss is supplied to the hard macro 301 through the low-level voltage supply lines 321' (ground lines).

Figure 13:
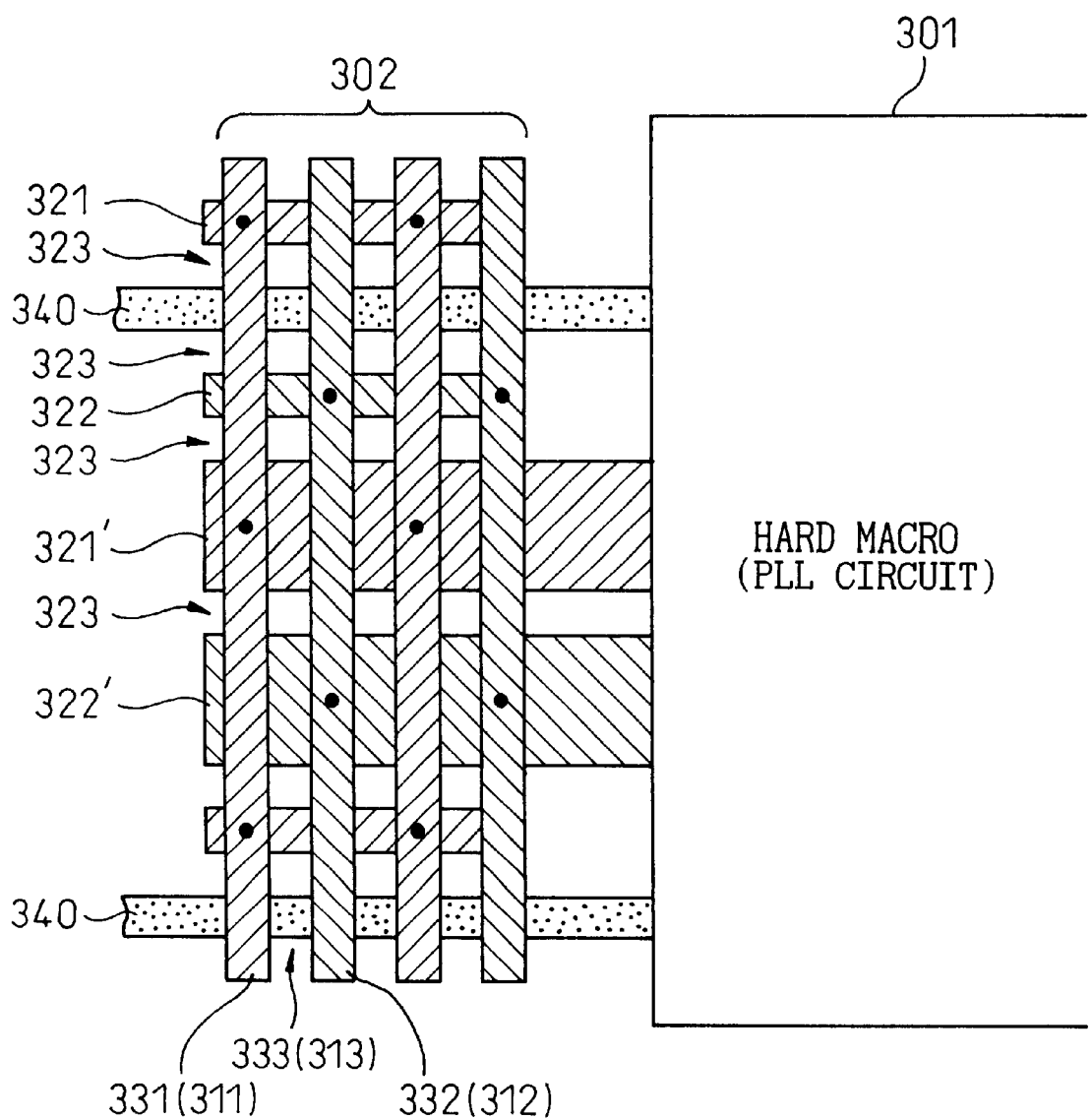
FIG. 13 is a plan view for explaining a modified example of the ring wiring for the hard macro shown in FIG. 11.

FIG. 13 is a plan view for explaining a modified example of the ring wiring for the hard macro shown in FIG. 11. In FIG. 13, reference numeral 340 indicates a signal line.

As shown in FIG. 13, signal transfers between the hard macro 301 and other circuits external or internal to the semiconductor integrated circuit device take place via the signal lines 340 provided, for example, in the second metal wiring layer (20) in parallel to the power supply lines 321 and 322 (321' and 322'). That is, in the second metal wiring layer (20), some of the power supply lines are replaced by the signal lines 340 so that signals can be transferred via the ring wiring region 302.

In FIG. 13, the connections between the hard macro 301 and the power supplies in the ring wiring region 302 are made using wide power supply lines 321' and 322' to prevent power supply capacity from dropping.

In the above structure, the thickness (TI) of each insulating film, the height (TM) and width (MW) of each power supply line, the distance (ID) between adjacent power supply lines, etc. can be varied as appropriate, and also, the number of metal wiring layers is not limited to two or three. It will further be noted that the metal wiring layers may be replaced by nonmetallic conductive layers (for example, polysilicon layers), and also that the capacitor circuit is not limited in application to a power supply bypass capacitor.

As detailed above, according to the capacitor circuit of the present invention, a plurality of first wiring lines, each functioning as the first electrode, and a plurality of second wiring lines, each functioning as the second electrode, are formed alternately one adjacent to the other in the same wiring layer; with this arrangement, the capacitance of the capacitor circuit can be made large without incurring an increase in the area it occupies.

Many different embodiments of the present invention may be constructed without departing from the spirit and scope of the present invention, and it should be understood that the present invention is not limited to the specific embodiments described in this specification, except as defined in the appended claims.

What is claimed is:

1. A capacitor circuit comprising a first electrode, a second electrode, and a dielectric interposed between said first and second electrodes, wherein,
   a plurality of first wiring lines, each function as said first electrode, and a plurality of second wiring lines, each functioning as said second electrode, are formed alternatively one adjacent to an other within the same wiring layer.

2. A capacitor circuit as claimed in claim 1, wherein said wiring layer includes a first wiring layer and a second wiring layer formed one above the other in adjacent fashion in a direction of layer thickness, and said first and second wiring lines in said first wiring layer are arranged in such a manner as to align respectively with said second and first wiring lines in said second wiring layer in the direction of layer thickness.

3. A capacitor circuit as claimed in claim 1, wherein said wiring layer includes a first wiring layer and a second wiring layer formed one above the other in adjacent fashion in a direction of layer thickness, and said first and second wiring lines in said first wiring layer are formed in such a manner as to intersect said first and second wiring lines in said second wiring layer.

4. A capacitor circuit as claimed in claim 1, wherein said wiring layer includes a first wiring layer, a second wiring layer, and a third wiring layer formed one above another in a direction of layer thickness, and wherein a plurality of said first wiring lines and a plurality of said second wiring lines are formed alternately one adjacent to the other in each of said first and third wiring layers, and contacts for connection to said first and second wiring lines in said first and third wiring layers are formed on said second wiring layer.

5. A capacitor circuit as claimed in claim 4, wherein a plurality of said first wiring lines and a plurality of said second wiring lines are formed alternately one adjacent to the other in said second wiring layer in such a manner as to intersect said first and second wiring lines in said first and third wiring layers.

6. A capacitor circuit as claimed in claim 1, wherein said first and second wiring lines are formed parallel to each other, each with a minimum line width, within said same wiring layer.

7. A capacitor circuit as claimed in claim 1, wherein said dielectric is an insulating film formed between said first and second wiring lines.

8. A capacitor circuit as claimed in claim 1, wherein each of said wiring layers is a metal wiring layer.

9. A capacitor circuit as claimed in claim 1, wherein said first and second wiring lines are ring wiring lines around a hard macro mounted on a semiconductor integrated circuit device.

10. A semiconductor integrated circuit device having a first power supply line and a second power supply line, wherein:
    a plurality of said first power supply lines and a plurality of said second power supply lines are formed alternately one adjacent to an other within the same metal wiring layer to construct a capacitor circuit.

11. A semiconductor integrated circuit device as claimed in claim 10, wherein said metal wiring layer includes a first metal wiring layer and a second metal wiring layer formed one above the other in adjacent fashion in a direction of layer thickness, and said first and second power supply lines in said first metal wiring layer are arranged in such a manner as to align respectively with said second and first power supply lines in said second metal wiring layer in the direction of layer thickness.

12. A semiconductor integrated circuit device as claimed in claim 10, wherein said metal wiring layer includes a first metal wiring layer and a second metal wiring layer formed one above the other in adjacent fashion in a direction of layer thickness, and said first and second power supply lines in said first metal wiring layer are formed in such a manner as to intersect said first and second power supply lines in said second metal wiring layer.

13. A semiconductor integrated circuit device as claimed in claim 10, wherein said metal wiring layer includes a first metal wiring layer, a second metal wiring layer, and a third metal wiring layer formed one above another in a direction of layer thickness, and wherein a plurality of said first power supply lines and a plurality of said second power supply lines are formed alternately one adjacent to the other in each of said first and third metal wiring layers, and contacts for connection to said first and second power supply lines in said first and third metal wiring layers are formed on said second metal wiring layer.

14. A semiconductor integrated circuit device as claimed in claim 13, wherein a plurality of said first power supply lines and a plurality of said second power supply lines are formed alternately one adjacent to the other in said second metal wiring layer in such a manner as to intersect said first and second power supply lines in said first and third metal wiring layers.

15. A semiconductor integrated circuit device as claimed in claim 10, wherein said first and second power supply lines are formed parallel to each other, each with a minimum line width, within said same wiring layer.

16. A semiconductor integrated circuit device as claimed in claim 10, wherein said power supply bypass capacitor circuit is constructed using ring wiring lines for a hard macro mounted on said semiconductor integrated circuit device.

* * * * *